United States Patent
Shawwa et al.

(10) Patent No.: US 8,861,291 B2
(45) Date of Patent: Oct. 14, 2014

(54) MEMORY APPARATUS AND SIGNAL DELAY CIRCUIT FOR GENERATING DELAYED COLUMN SELECT SIGNAL

(71) Applicants: Amna Shawwa, Sugar land, TX (US); Phat Truong, Houston, TX (US)

(72) Inventors: Amna Shawwa, Sugar land, TX (US); Phat Truong, Houston, TX (US)

(73) Assignee: Nanya Technology Corporation, Taoyuan (TW)

( * ) Notice: Subject to any disclaimer, the term of this patent is extended or adjusted under 35 U.S.C. 154(b) by 161 days.

(21) Appl. No.: 13/711,627

(22) Filed: Dec. 12, 2012

(65) Prior Publication Data

US 2014/0160873 A1    Jun. 12, 2014

(51) Int. Cl.
*G11C 7/00* (2006.01)
*H03H 11/26* (2006.01)
*G11C 7/06* (2006.01)

(52) U.S. Cl.
CPC . *H03H 11/26* (2013.01); *G11C 7/06* (2013.01)
USPC ..................................... 365/194; 365/189.15

(58) Field of Classification Search
USPC ......... 365/194, 189.15, 189.16; 327/198, 546
See application file for complete search history.

(56) References Cited

U.S. PATENT DOCUMENTS 5,220,205 A * 6/1993 Shigehara et al. ............ 327/198

* cited by examiner

*Primary Examiner* — Vu Le
(74) *Attorney, Agent, or Firm* — Jianq Chyun IP Office (57) ABSTRACT

The invention provides a memory apparatus and a signal delay circuit thereof. The signal delay circuit provided by present disclosure includes an input inverter, a first inverter, a capacitor, a first transistor, a second inverter and output inverter. The input inverter receives an input signal and output a signal to the first inverter. The capacitor coupled to an output terminal of the first inverter. The second terminal of the first transistor coupled to the output terminal of the first inverter and the first terminal of the first transistor coupled to an operating voltage. An input terminal of the second inverter is coupled to the output terminal of the first inverter and an output terminal of the second inverter is coupled to the control terminal of the first transistor. The output inverter is used to generate a delayed output signal.

15 Claims, 6 Drawing Sheets

MEMORY APPARATUS AND SIGNAL DELAY CIRCUIT FOR GENERATING DELAYED COLUMN SELECT SIGNAL

BACKGROUND OF THE DISCLOSURE

1. Field of Disclosure

The present disclosure generally relates to a memory apparatus, and more particularly to a signal delay circuit for generating a delayed column select signal with wider pulse to provide to the memory apparatus.

2. Description of Prior Art

For a memory apparatus in prior art, a column select signal must be provided to a sense amplifier in the memory apparatus when a writing operation of the memory apparatus is executing. The column select signal is used to turn on a switch pair for transmitting data and inverted data to the sense amplifier. It is important that the column select signal must have a proper pulse width to insure the proper data transmitted to the sense amplifier.

Figure 1A:
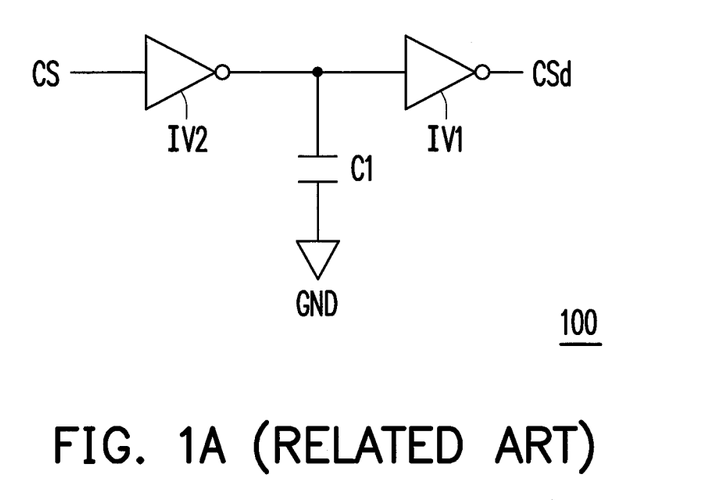
FIG. 1A is a circuit diagram of a signal delay circuit 100 in prior art.

Referring to the FIG. 1A, FIG. 1A is a circuit diagram of a signal delay circuit 100 in prior art. The signal delay circuit 100 includes an inverter IV1, an inverter IV2 and a capacitor C1. The inverter IV1 has an input terminal for receiving a column select signal CS, and an output terminal coupled to the capacitor C1 and an input terminal of the inverter IV2. The capacitor C1 is coupled between the output terminal of the inverter IV1 and a ground voltage. An output the inverter IV1 generates a delayed column select signal CSd.

Figure 1B:
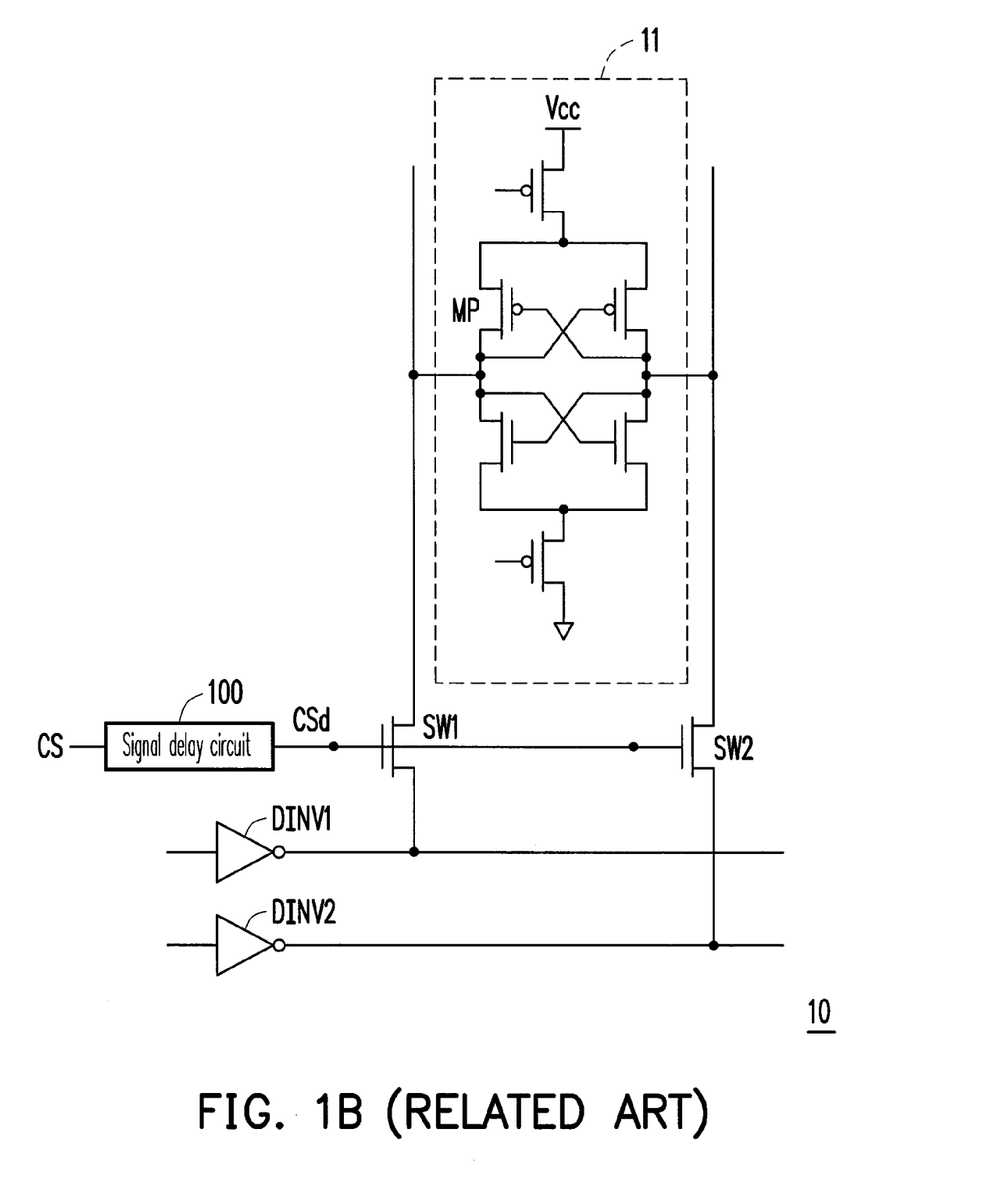
FIG. 1B is a memory apparatus 10 in prior art.

Referring to the FIG. 1B and FIG. 1A, wherein FIG. 1B is a memory apparatus 10 in prior art. The memory apparatus 10 includes the signal delay circuit 100, a sense amplifier 11, switches SW1 and SW2 and data-in drivers DINV1 and DINV2. There is a problem when the intended written data has the opposite polarity of the sens amplifier 11 polarity where data "0" is the opposite polarity of the data "1" or vis versa intended to be written into a memory cell in the memory apparatus 10, and the P-type transistors MP (MOS transistors) in the sense amplifier 11 which coupled to the signal delay circuit 100 is stronger (faster) device, and the N-type transistors (MOS transistors) in the data-in drivers DINV1, DINV2 and SW1, SW2 are weaker (slower) devices. The weaker drivers (N-type transistors in the data-in drivers DINV1, DINV2) and SW1, SW2 (which are N-Type) have to fight the strong device (P-type transistor MP in the sense amplifier 11) to pull a data line coupled to the sense amplifier to opposite digital data. Therefore, in this case, the delayed column select signal CSd with a longer pulse width is needed. However, in prior art, the pulse width of the delayed column select signal CSd cannot be optimized according to the process variation, such as that, the efficiency of the memory apparatus is reduced correspondingly.

SUMMARY OF THE INVENTION

The present disclosure provides a signal delay circuit for generating a delayed output signal with a pulse width varied according to the process variation thereof.

The present disclosure provides a memory apparatus having a signal delay circuit for receiving a column select signal and providing a delayed column select signal. Wherein, the pulse width of the delayed column select signal is varied according to the process variation thereof.

The signal delay circuit provided by present disclosure includes an input inverter, a first inverter, a capacitor, a first transistor, a second inverter and output inverter. The input inverter receives an input signal and output a signal to the first inverter. The capacitor coupled to an output terminal of the first inverter. The first transistor having a first terminal, a second terminal and a control terminal, and the second terminal of the first transistor coupled to the output terminal of the first inverter and the first terminal of the first transistor coupled to an operating voltage. An input terminal of the second inverter is coupled to the output terminal of the first inverter and an output terminal of the second inverter is coupled to the control terminal of the first transistor. An input terminal of the output inverter is coupled to the output terminal of the second inverter and a delayed output signal is generated at an output terminal of the output inverter.

The memory apparatus disclosed by the present disclosure includes a sense amplifier, a data path switch and a signal delay circuit. The data path switch is coupled to the sense amplifier, and the data path switch is used for receiving a delayed column select signal. The data path switch sends the data signal and the inverted data signal to the sense amplifier according to the delayed column select signal. The signal delay circuit coupled to the data path switches, and is used for receiving a column select signal and generating the delayed column signal by delaying the column select signal. The signal delay circuit provided by present disclosure includes an input inverter, a first inverter, a capacitor, a first transistor, a second inverter and output inverter. The input inverter receives an input signal and output a signal to the first inverter. The capacitor coupled to an output terminal of the first inverter. The first transistor having a first terminal, a second terminal and a control terminal, and the second terminal of the first transistor coupled to the output terminal of the first inverter and the first terminal of the first transistor coupled to an operating voltage. An input terminal of the second inverter is coupled to the output terminal of the first inverter and an output terminal of the second inverter is coupled to the control terminal of the first transistor. An input terminal of the output inverter is coupled to the output terminal of the second inverter and a delayed output signal is generated at an output terminal of the output inverter.

Accordingly, the present disclosure discloses a circuit structure of a signal delay circuit, and the signal delay circuit can generates a delayed output signal by delaying the second edge (failing edge) of an input signal of the signal delay circuit a delay time. Wherein the delay time is determined by the process parameter of the transistor in the signal delay circuit. That is, a pulse width of the delayed output signal is varied according to the process variation when the chip which the signal delay circuit embedded in, and an optimum pulse width of the delayed output signal can be obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiment of the invention, examples of which are illustrated in the accompanying drawings. Wherever possible, the same reference numbers are used in the drawings and the description to refer to the same or like parts.

Figure 2A:
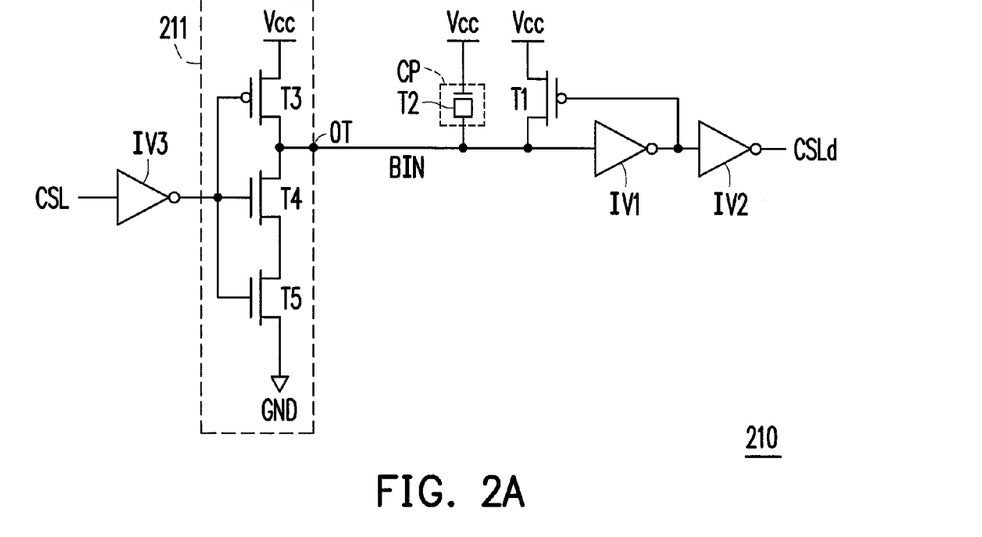
FIG. 2A-FIG. 2C are circuit diagrams of a plurality of signal delay circuits 210-240 according to an embodiment of the present disclosure.

Referring to FIG. 2A, FIG. 2A is a circuit diagram of a signal delay circuit 210 according to an embodiment of the present disclosure. The signal delay circuit 210 includes an input inverter IV3, an inverter 211, a capacitor CP, a transistor T1 and inverters IV1 and an output inverter IV2. The input inverter IV3 and the inverter 211 form an input buffer. The input inverter IV3 receives an input signal CSL and the output terminal of the input inverter IV3 coupled to the inverter 211. The input of the inverter 211 receives an inverted input signal form the output terminal of the input inverter IV3, and the output terminal OT of the inverter 211 generates an inverted input signal BIN. Please notice here, in this embodiment, the input inverter IV3 can be replaced to any other logical cell such as NAND or NOR gate.

The inverter 211 includes transistors T3-T5. A first terminal of the transistor T3 is coupled to a reference voltage, and the reference voltage is an operating voltage Vcc in this embodiment. A second terminal of the transistor T3 is coupled to the output terminal OT of the inverter 211, and a control terminal is coupled to the output terminal of the input inverter IV3 and the control terminals of transistors T4 and T5. A first terminal of the transistor T4 coupled to the output terminal OT of the inverter 211 and a second terminal thereof is coupled to a first terminal of the transistor T5. Moreover, a second terminal of the transistor T5 is coupled to a reference voltage GND. In this embodiment, the reference voltage GND is a ground voltage.

The capacitor CP is coupled to the output terminal OT of the inverter 211 and the operating voltage Vcc in serial. A first terminal of the transistor T1 is coupled to the operating voltage Vcc, a second terminal of the transistor T1 is coupled to the output terminal OT of the inverter 211 and a control terminal coupled to an output terminal of the inverter IV1. Besides, an input terminal of the inverter IV1 is coupled to the output terminal OT of the inverter 211. The transistor T1 and the inverter IV1 form a latch circuit in FIG. 2A, and the capacitor CP is a MOS capacitor formed by a P-type transistor T2. Wherein, the first and second terminals of the transistor T2 are coupled together to the operating voltage Vcc, and the control terminal of the transistor T2 is coupled to the output terminal OT.

In this embodiment, if the P-type transistors T1-T3 are stronger (faster) devices and the N-type transistors T4-T5 are weaker (slower) devices. When the input signal CSL inputted to the signal delay circuit 210 changes to logical high ("1") level, the signal on the output terminal OT can be pulled to logical high level ("1") quickly according to the high driving current of transistors T1-T3. Then, when the input signal CSL inputted to the signal delay circuit 210 changes to logical low level ("0") from the logical high level, the weaker devices (N-type transistor N4 and N5) pull down the voltage on the output terminal OT slowly. And because the inverter 211 has to fight with the strong T1 to pull BIN to low level. Thus, the falling edge of the input signal CSL is delayed for generating delayed wider positive pulse of the delayed output signal CSLd. The positive pulse width of the inverted input signal BIN is longer than the positive pulse width of the input signal CSL, and positive pulse width of the delayed output signal CSLd is longer than the input signal CSL, too.

On the contrary, if the P-type transistors T1-T3 are weaker (slower) devices, and the N-type transistors T4-T5 are stronger (faster) devices. When the input signal CSL inputted to the signal delay circuit 210 changes to logical high ("1") level, the signal on the output terminal OT can be pulled to logical high level ("1") slowly according to the low driving current of transistors T1-T3. Then, when the input signal CSL inputted to the signal delay circuit 210 changes to logical low level ("0") from the logical high level, the stronger devices (N-type transistor N4 and N5) pull down the voltage on the output terminal OT quickly. That is, the positive pulse width of the inverted input signal BIN is smaller than the positive pulse width of the input signal CSL, and positive pulse width of the delayed output signal CSLd is smaller than the input signal CSL, too.

Figure 2B:
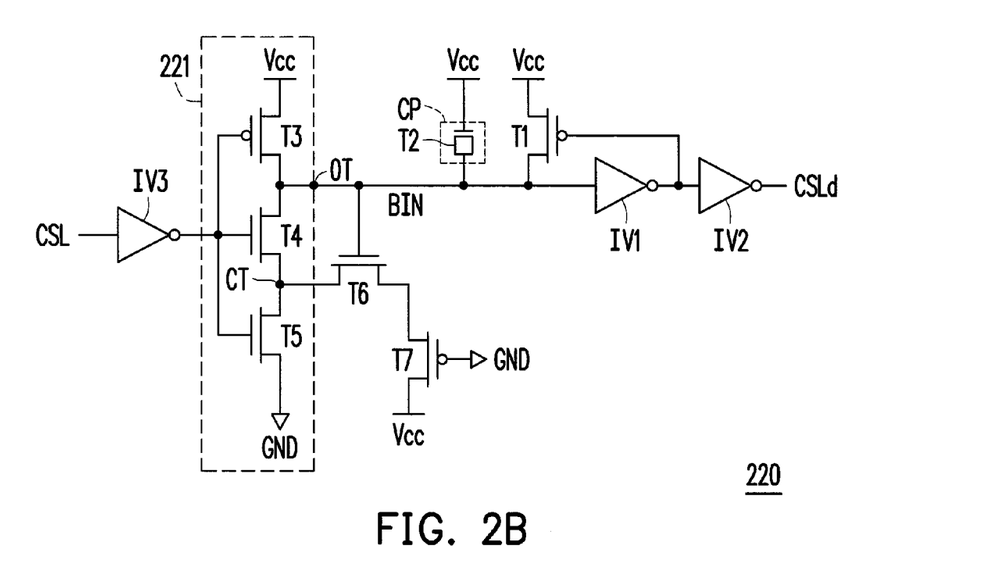

Referring to FIG. 2B, FIG. 2B is a circuit diagram of a signal delay circuit 220 according to the other embodiment of the present disclosure. The signal delay circuit 220 includes an input inverter IV3, a inverter 221, a capacitor CP, transistors T1, T6 and T7, an inverters IV1 and an output inverter IV2. Different from the signal delay circuit 210, the signal delay circuit 220 further includes the transistors T6 and T7. A first terminal of the transistor T6 is coupled to the coupled terminal of the transistors T4 and T5, a control terminal of the transistor T6 is coupled to the output terminal OT of the inverter 221, a second terminal of the transistor T6 is coupled to a first terminal of the transistor T7. Moreover, a second terminal of the transistor T7 is coupled to the operating voltage Vcc and a control terminal of the transistor T7 is coupled to the reference voltage GND.

In this embodiment, the transistor T6 is an N-type transistor and the transistor T7 is a P-type transistor. If the P-type transistor T7 is stronger (faster) device, and the N-type transistor T6 is weaker (slower) device. When the input signal CSL keeps on logical high level, the voltage level on the output terminal OT of the inverter 221 is equal to the logical high level. Accordingly, the transistor T6 is turned on, and transistor T7 provides a pull up current through the transistor T6 to pull up the voltage level on the terminal CT of the transistor T6 which is coupled to the transistors T4 and T5. Then, when the input signal CSL changes to logical low level form logical high level, the transistor T4 is turned on, and the charge kept at the terminal CT is provided to the terminal OT. Such as that, the positive pulse width of the inverted input signal BIN is increased accordingly, and the positive pulse width of the delayed output signal CSLd is increased correspondingly. Please note that, the signal delay circuit 220 generates a delay by transistors T6, T7 to delay the input signal CSL, but the delay is not increased when P-type device is strong and N-type device is weak. The transistor T1 is the one that increases the delay when strong P-type device and weak N-type device since transistor T4 has to fight with stronger T1 to pull the inverted input signal BIN to ground voltage.

Figure 2C:
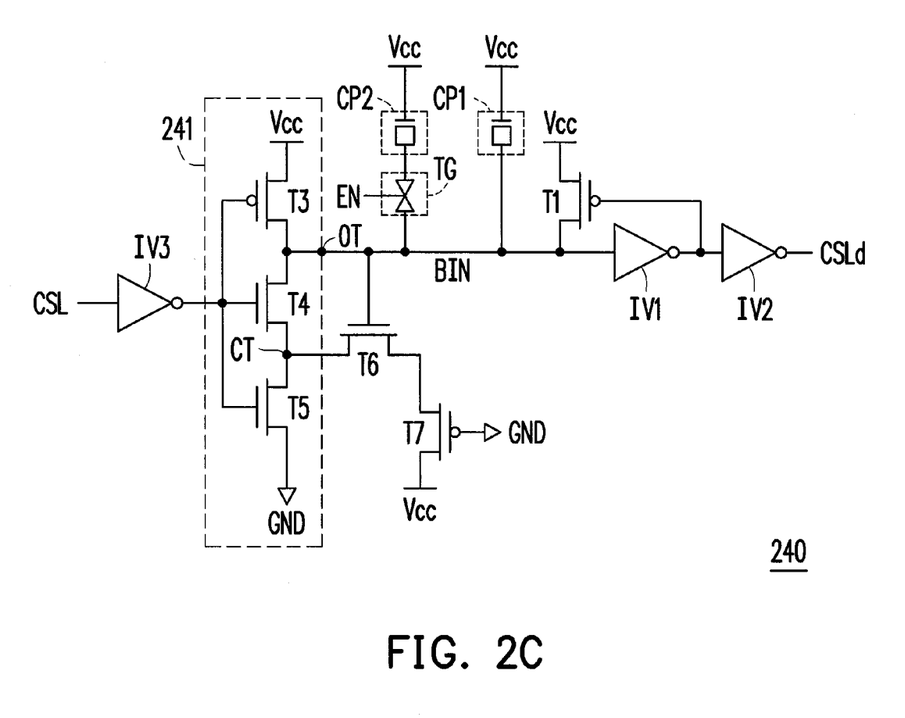

Referring to FIG. 2C, FIG. 2C is a circuit diagram for a signal delay circuit 240. The signal delay circuit 240 includes an inverter 241, capacitors CP1 and CP2, transistors T1, T6 and T7, an inverter IV1, an output inverter IV2, input inverter IV3 and a pass gate TG. Different from the signal delay circuit 220, the signal delay circuit 240 further includes the capacitor CP2 and the pass gate TG. A first terminal of the capacitor CP2 is coupled to the operating voltage Vcc, and a second terminal of the capacitor CP2 is coupled to a first terminal of the pass gate TG. A second terminal of the pass gate TG is coupled to the terminal OT, and the pass gate TG is controlled by an enable signal EN. When the pass gate TG is turned on by the enable signal EN, the second terminal of the capacitor CP2 is connected to the terminal OT through the pass gate TG. The capacitor CP2 is formed by a P-type transistor, and can cause the width of the positive pulse of the delayed output signal CSLd wider when the P-type transistor is stronger device.

Figure 3:
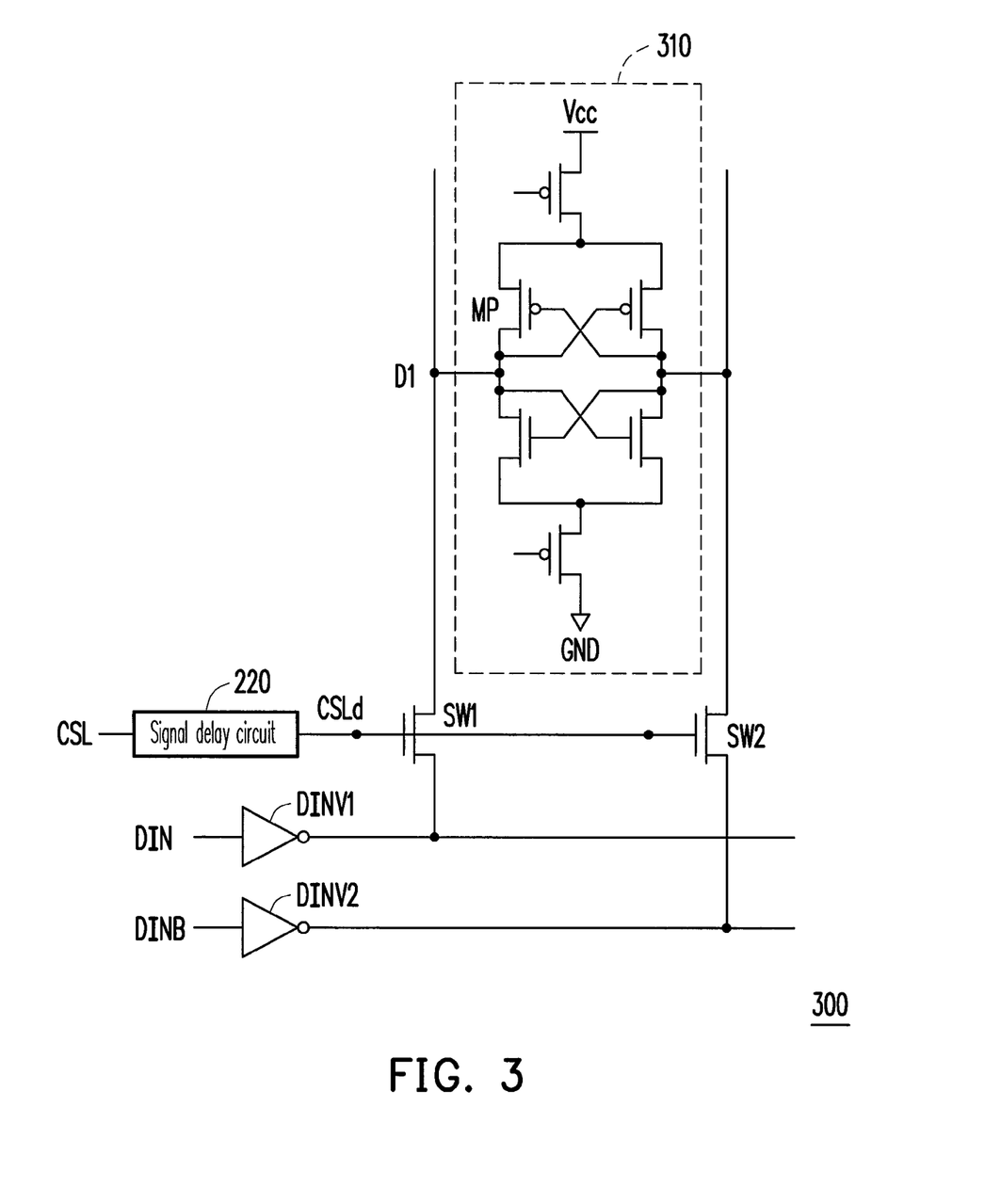
FIG. 3 is an application circuit diagram for the signal delay circuit 220.

Referring to FIG. 2B and FIG. 3, wherein, FIG. 3 is an application circuit diagram for the signal delay circuit 220. The signal delay circuit 220 is coupled to switches SW1 and SW2. The switches SW1 and SW2 are controlled by the delayed output signal CSLd generated by the signal delay circuit 220. Moreover, the switches SW1 and SW2 are coupled to the drivers DINV1 and DINV2 respectively, and switches SW1 and SW2 transport data DIN and DINB to sense amplifier 310 according to the delayed output signal CSLd. If the P-type transistors T1, T3 and T7 are stronger (faster) devices, and the N-type transistors T4-T6 are weaker (slower) devices, the P-type transistor MP in sense amplifier 310 is also a stronger (faster) device. The signal delay circuit 220 provides the delayed output signal CSLd with a wider positive pulse width, such as that, the switches SW1, SW2 well remain on longer thus because of the wider positive pulse width thus the driver DINV1 has a longer time to pull the data signal D1 down to ground voltage successfully when the data DIN is logical low level.

Figure 4:
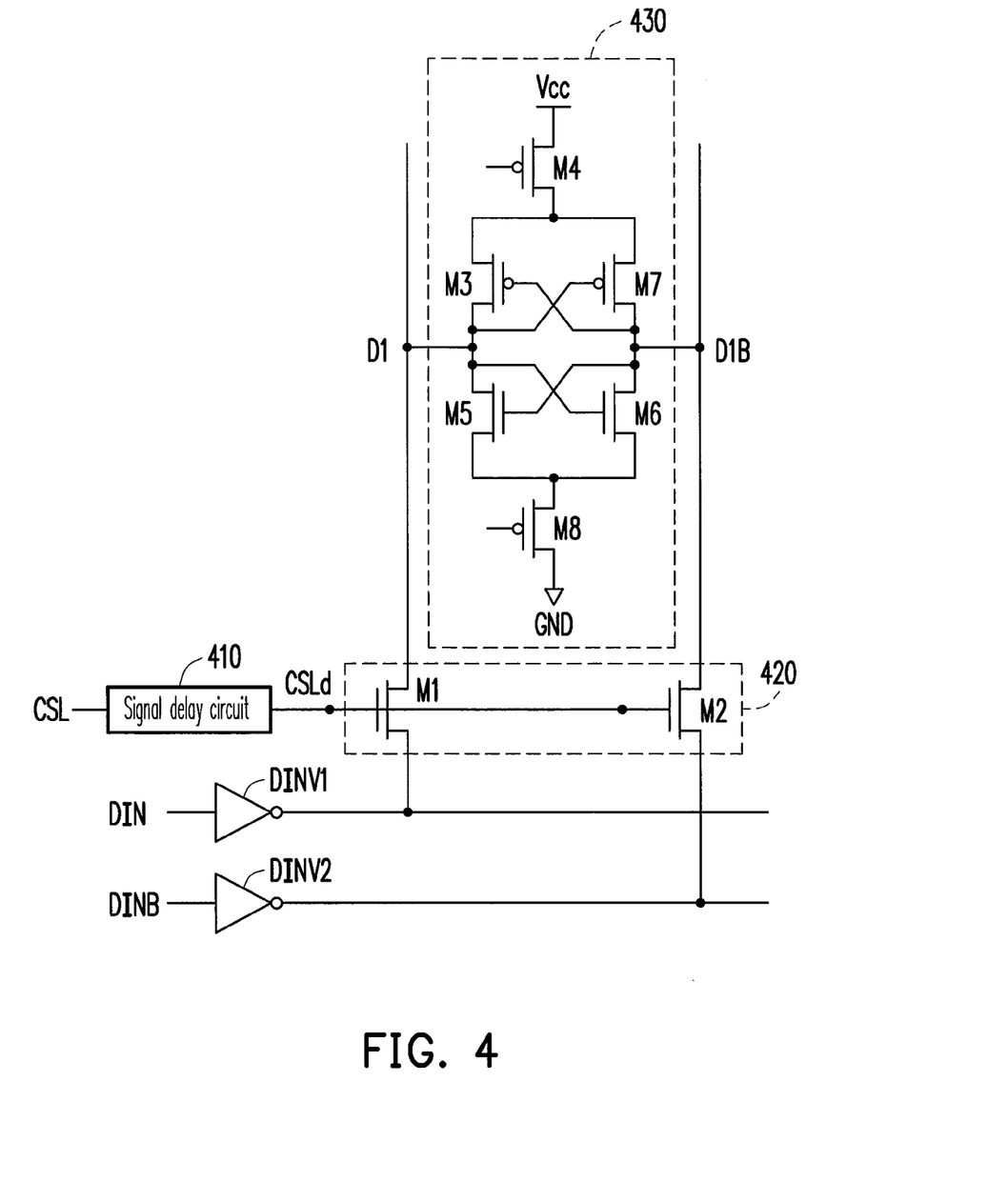
FIG. 4 is a circuit diagram of a memory apparatus 400 according to an embodiment of the present disclosure.

Referring to FIG. 4, FIG. 4 is a circuit diagram of a memory apparatus 400 according to an embodiment of the present disclosure. The memory apparatus 400 includes a signal delay circuit 410, a data path switch 420 and a sense amplifier 430. The sense amplifier 430 is formed by transistors M3-M8. The signal delay circuit 410 coupled to the data path switch 420, and the signal delay circuit 410 receives a column select signal CS and generates a delayed column select signal CSLd. The delayed column select signal CSLd is provided to the gates of the transistors M1 and M2, and the transistors M1 and M2 are turned on or off according to the delayed column select signal CSLd. The drivers DINV1 and DINV2 receives a data signal DIN and an inverted data signal DINB respectively, and provide data signal D1 and D1B respectively to the data lines of sense amplifier 430 when the transistors M1 and M2 are turned on. The drivers DINV1 and DINV2 are writer-driving circuits for the sense amplifier 430.

When writing operation is executed, the drivers DINV1 and DINV2 drive the data DIN and DINB through the switches formed by the transistors M1 and M2 which are enabled by the positive pulse CSLd. If the data signal DIN is equal to logical low level, the data signal D1 on the sense amplifier 430 should be pulled down to logical low level. That is, the driver DINV1 must fight with the transistor M3 for pulling down the data signal D1, when the data signal D1 has opposite polarity. If transistor M3 is a strong P-type transistor and transistor M1 and the N-type transistor of driver DINV1 are weak N-type device, the turned on time of the transistor M1 must be extended to ensure that the data signal D1 is fully pulled down to low level.

The signal delay circuit 410 can be implemented by the signal delay circuits 210, 220 or 240, and the signal delay circuits 210, 220 or 240 provides the delayed output signal CSLd to be the delayed column signal CSLd. By according to the discussions about FIGS. 2A, 2B, 2C, the positive pulse width of the delayed column signal CSLd generated by signal delay circuit 410 can be increased, and the data signal D1 can be pulled down successfully.

In summary, in the disclosure, the delayed column select signal is generated according to the process variation of the chip where the memory apparatus belonged to. The correctness of the data provided to the sense amplifier can be assured, and the writing time for the memory apparatus can be optimized, too. The efficiency of the memory apparatus can be improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What claimed is:

1. A signal delay circuit, comprising:
   an input inverter, for receiving an input signal and outputting an inverted input signal;
   a first inverter, having a input terminal and an output terminal, the input terminal of the inverter is coupled to the input inverter for receiving the inverted input signal;
   a first capacitor, coupled to an output terminal of the first inverter;
   a first transistor, having a first terminal, a second terminal and a control terminal, the second terminal of the first transistor being coupled to the output terminal of the first inverter and the first terminal of the first transistor being coupled to a first reference voltage;
   a second inverter, an input terminal of the second inverter being coupled to the output terminal of the first inverter and an output terminal of the second inverter being coupled to the control terminal of the first transistor; and
   an output inverter, an input terminal of the output inverter being coupled to the output terminal of the second inverter and a delayed output signal being generated at an output terminal of the output inverter.

2. The signal delay circuit according to claim 1, wherein the first capacitor comprises:
   a second transistor, having a first terminal, a second terminal and a control terminal, the control terminal of the second transistor is coupled to one of the output terminal of the first inverter, the first and second terminals of the second transistor are coupled to the first reference voltage.

3. The signal delay circuit according to claim 2, wherein the first and the second transistors are P-type transistors, and the first reference voltage is an operating voltage.

4. The signal delay circuit according to claim 1, wherein the first inverter comprises:
   a third transistor, having a first terminal, a second terminal and a control terminal, the first terminal of the third transistor is coupled to the first reference voltage, the second terminal of the third transistor is coupled to the output terminal of the first inverter;
   a fourth transistor, having a first terminal, a second terminal and a control terminal, the first terminal of the fourth is coupled to the second terminal of the third transistor, the control terminal of the fourth transistor is coupled to the control terminal of the third transistor for receiving the input signal; and
   a fifth transistor, having a first terminal, a second terminal and a control terminal, the first terminal of the fifth transistor is coupled to the second terminal of the fourth transistor, the control terminal of the fifth transistor is coupled to the control terminal of the fourth transistor, and the second terminal of the fifth transistor is coupled to a second reference voltage.

5. The signal delay circuit according to claim 4, further comprising:
   a sixth transistor; having a first terminal, a second terminal and a control terminal, the first terminal of the sixth transistor is coupled to the second terminal of the fourth transistor, the control terminal of the sixth transistor is coupled to the output terminal of the first inverter; and
   a seventh transistor, having a first terminal, a second terminal and a control terminal, the first terminal of the seventh transistor coupled to the second terminal of the sixth transistor, the control terminal of the seventh transistor coupled to the second reference voltage, and the second terminal of the seventh transistor coupled to the first reference voltage.

6. The signal delay circuit according to claim 4 wherein the third and the seventh transistors are P-type transistors, the fourth, the fifth and the sixth transistors are all N-type transistors, and the first reference voltage is an operating voltage, the second reference voltage is a ground voltage.

7. The signal delay circuit according to claim 1, further comprising:
   a second capacitor, a first terminal of the second capacitor is coupled to the operating voltage; and
   a pass gate, a first terminal of the pass gate is coupled to the second terminal of the second capacitor, a second terminal of the pass gate is coupled to the output terminal, the pass gate is turned on or off according to a control signal.

8. A memory apparatus, comprising:
   a sense amplifier;
   a data path switch, coupled to the sense amplifier, for receiving a delayed column select signal, a data signal and an inverted data signal, the data path switch sending the data signal and the inverted data signal to the sense amplifier according to the delayed column select signal; and
   a signal delay circuit, coupled to the data path switch, receiving a column select signal and generating the delayed column signal by delaying the column select signal, the signal delay circuit comprising:
      a first inverter, for receiving the column select signal and outputting a buffered input signal;
      a first capacitor, coupled to an output terminal of the first inverter;
      a first transistor, having a first terminal, a second terminal and a control terminal, the second terminal of the first transistor is coupled to the output terminal of the first inverter and the first terminal of the first transistor is coupled to a first reference voltage;
      a second inverter, an input terminal of the second inverter being coupled to the output terminal of the first inverter and an output terminal of the second inverter being coupled to the control terminal of the first transistor; and
      an output inverter, an input terminal of the output inverter being coupled to the output terminal of the second inverter and a delayed output signal being generated at an output terminal of the output inverter.

9. The memory apparatus according to claim 8, wherein the signal delay circuit further comprises:
   an output stage buffer, having an input terminal coupled to the output terminal of the inverter, and having an output terminal for outputting the delayed column signal.

10. The memory apparatus according to claim 8, wherein the first capacitor comprises:
    a second transistor, having a first terminal, a second terminal and a control terminal, the control terminal of the second transistor coupled to one of the output terminal of the first inverter, the first and the second terminals are coupled to the first reference voltage.

11. The memory apparatus according to claim 10, wherein the first and second transistors are P-type transistors, and the first reference voltage is an operating voltage.

12. The memory apparatus according to claim 11, wherein the first inverter comprises:
    a third transistor, having a first terminal, a second terminal and a control terminal, the first terminal of the third transistor coupled to the first reference voltage, the second terminal of the third transistor coupled to the output terminal of the first inverter;
    a fourth transistor, having a first terminal, a second terminal and a control terminal, the first terminal of the fourth coupled to the second terminal of the third terminal, the control terminal of the fourth transistor coupled to the control terminal of the third transistor for receiving the column select signal; and
    a fifth transistor, having a first terminal, a second terminal and a control terminal, the first terminal of the fifth transistor coupled to the second terminal of the fourth transistor, the control terminal of the fifth transistor coupled to the control terminal of the fourth transistor, and the second terminal of the fifth transistor coupled to a second reference voltage.

13. The memory apparatus according to claim 12, wherein the signal delay circuit further comprises:
    a sixth transistor; having a first terminal, a second terminal and a control terminal, the first terminal of the sixth transistor coupled to the second terminal of the fourth transistor, the control terminal of the sixth transistor coupled to the output terminal of the first inverter; and
    a seventh transistor, having a first terminal, a second terminal and a control terminal, the first terminal of the seventh transistor coupled to the second terminal of the sixth transistor, the control terminal of the seventh transistor coupled to the second reference voltage, and the second terminal of the seventh transistor coupled to the first reference voltage.

14. The memory apparatus according to claim 12, wherein the third and the seventh transistors are P-type transistors, the fourth, the fifth and the sixth transistors are all N-type transistors, and the first reference voltage is an operating voltage, the second reference voltage is a ground voltage.

15. The signal delay circuit according to claim 8, wherein the signal delay circuit further comprises:
    a second capacitor, a first terminal of the second capacitor is coupled to the operating voltage; and
    a pass gate, a first terminal of the pass gate is coupled to the second terminal of the second capacitor, a second terminal of the pass gate is coupled to the output terminal, the pass gate is turned on or off according to a control signal.

* * * * *